United States Patent [19]

Bushner

[11] Patent Number: 5,636,103

[45] Date of Patent: Jun. 3, 1997

[54] PORTABLE AIR COOLING APPARATUS FOR ELECTRONIC COMPONENTS

[76] Inventor: Edward M. Bushner, 632 E. Bishop Pl., Northampton, Pa. 18067

[21] Appl. No.: 489,476

[22] Filed: Jun. 12, 1995

[51] Int. Cl.⁶ ............................................... H05K 7/20
[52] U.S. Cl. ..................... 361/695; 165/80.3; 361/687; 361/809
[58] Field of Search .................. 165/12, 122, 126, 165/80.3; 361/687, 695, 690, 694, 807, 809; 174/15.1, 16.1; 248/208; 415/119, 213.1, 215.1; 454/184, 207; 310/62, 63, 68 C; 200/294; 236/11, 94, 78 D

[56] References Cited

U.S. PATENT DOCUMENTS

| | | | |
|---|---|---|---|
| 3,778,551 | 12/1973 | Grodinsky | 179/1 E |
| 4,383,286 | 5/1983 | Hicks | 361/695 |
| 4,560,972 | 12/1985 | Britt | 337/338 |
| 4,625,328 | 11/1986 | Freadman | 381/111 |
| 4,662,268 | 5/1987 | Beavers | 98/39.1 |
| 4,837,731 | 6/1989 | Levine | 364/145 |
| 4,860,361 | 8/1989 | Sato et al. | 381/55 |
| 4,913,621 | 4/1990 | Reither | 415/215.1 |
| 5,107,398 | 4/1992 | Bailey | 361/384 |
| 5,121,291 | 6/1992 | Cope | 361/384 |
| 5,195,869 | 3/1993 | Groenhoff | 415/213.1 |
| 5,208,730 | 5/1993 | Tracy | 361/384 |
| 5,216,579 | 6/1993 | Basara et al. | 361/383 |

FOREIGN PATENT DOCUMENTS 4-186699A 7/1992 Japan ......................... 361/695

*Primary Examiner*—Gerald P. Tolin
*Attorney, Agent, or Firm*—John D. Gugliotta

[57] ABSTRACT

A portable air cooling apparatus for electronic components is provided comprising a compact fan which is situated horizontally, and which is mounted to four one inch legs protruding vertically downward. Each leg has a rubber boot to provide vibration free contact with the upper surface of an electronic component. Attached to the side of the fan is a settable thermal switch that alternately engages and disengages the fan, and a knob to control the setting at which to begin the delivery of cooling air. A 110 volt plug and power cord are provided to supply the energy required to drive the fan.

2 Claims, 5 Drawing Sheets

PORTABLE AIR COOLING APPARATUS FOR ELECTRONIC COMPONENTS

BACKGROUND OF THE INVENTION

1. Field of the Invention

The present invention relates generally to methods to and devices for cooling electronic components, and, more particularly, to compact, portable, adjustable air cooling devices that can be utilized with a variety of different electronic components.

2. Description of the Related Art

As is well-known in the art, heat generated from the use of electronic components is a continuous source of problems. Such heat generation interferes with the proper functioning of those very same components. As an example, recent developments in computer technology have resulted in smaller and smaller electronic devices. As a result, the problems associated with the heat generated by such devices are magnified due to such small sizes.

In the related art of cooling computer devices, many methods of providing adequate air cooling have been utilized. For example, in U.S. Pat. No. 5,216,579 issued in the name of Basara et al., a rack based packaging system for computers with cable, cooling and power management module is disclosed. In the Basara et al. reference, a method of cooling both components and wiring is disclosed wherein the wiring conduits are dually utilized to direct cooling air flow, thereby simultaneously cooling the wiring as well. This generally shows the current approach in the related arts toward providing built-in, or physically attached methods to cool components.

Another example of this approach is described in U.S. Pat. No. 5,107,398, issued in the name of Bailey. In the Bailey reference, a cooling system for computers is disclosed, showing a typical method of providing fan-driven cooling air built into the component. In the Bailey reference, and additional novel method is also disclosed providing positive static pressure within the component housing.

These approaches, however, although effective, are not without their drawbacks. Such fixed systems are nonadaptable to other components, and must necessarily be "over-engineered" in order to insure the availability of adequate amounts of cooling air under many unknown potential circumstances.

Another problem occurs specifically from the use of electronically amplified stereo equipment. Although the lack of a proper amount of cooling will not always result in an immediate catastrophic failure of electronic stereo components, such a lack of proper cooling will result in a degradation of the quality of audio output, as well as an eventual shortening of component life.

Numerous attempts have been made to correct for this foregoing problem. For instance, U.S. Pat. No. 3,778,551, issued in the name of Grodinsky, discloses an air cooled audio amplifier assembly. An invention made in accordance with the Grodinsky reference mounts the heat generating and heat sensitive components, the transistors, in the same housing as the speakers, thereby allowing the movement of the speaker cones to pump cooling air across a transistor heat sink, thereby improving cooling over a merely static-air situation.

Also, in U.S. Pat. No. 4,625,328, issued in the name of Freadman, an integrated amplifier and speaker system with improved cooling efficiency is disclosed which again utilizes the air-pumping characteristics of a speaker cone to provide cooling air movement. However, a device made in accordance with either the Grodinsky reference or the Freadman reference is associated with several drawbacks. For example, the component system architecture is severely limited by the characteristics and functioning of the speakers. Also, the volume of air which can be "pumped" by a vibrating speaker cone is extremely limited. Moreover, such a system is once again a built-in solution to only one problem and does not allow for adaptability, portability, or variability in demand or conditions.

Additionally, U.S. Pat. No. 4,860,361, issued in the name of Sato et al. discloses an acoustic-device cooling unit which once again provides a built-in cooling fan. In the Sato et al. reference, a variable drive mechanism is also disclosed which varies the fan speed proportional to either the input or output signal level of an acoustical device.

Consequently, a need has therefore been felt for an improved but less complex mechanism that can provide variable, portable, and adaptable "on the spot" cooling under a variety of conditions and with a variety of different components.

SUMMARY OF THE INVENTION

It is therefore an object of the present invention to provide an improved portable air cooling apparatus for electronic components.

It is a further object of the present invention to provide a moveable and compact portable air cooling apparatus for electronic components.

It is yet another object of the present invention to provide a portable air cooling apparatus that can be adjustably set to turn on and off at various setpoints based upon the user's current needs.

It is also yet another object of the present invention to provide a low cost air cooling apparatus that can be portably utilized in a variety of situations.

It is a feature of the present invention to provide an improved air cooling apparatus for electronic components that is portable.

It is another feature of the present invention to provide an improved air cooling apparatus for electronic components that can be adjusted to provide cooling air at various setpoints to accommodate differing applications.

Briefly described according to the preferred embodiment of the present invention, a compact fan is situated horizontally, and is mounted to four one-inch legs protruding vertically downward. Each leg has a rubber boot to provide vibration free contact with the upper surface of an electronic component. Attached to the side of the fan is a settable thermal switch that engages the fan, and a knob to control the setting at which to begin the delivery of cooling air. A 110 volt plug and power cord are provided to supply the energy required to drive the fan.

In accordance with a preferred embodiment, the user would place the unit on top of a stereo receiver, VCR, or other similar type of electronic component. The present invention would be plugged into a standard 110 volt outlet, and the thermal switch would be set via a knob to the desired setpoint. The electronic component would then be utilized as it normally would, with the present invention providing cooling air when needed or desired. Cooling air would then cease when no longer required.

Advantages of the present invention is that it is small, compact, economical, and portable, allowing it to be utilized in a variety of situations and with various types of electronic components on an as-needed basis.

Other advantages of the present invention are that it improves the efficiency, performance, and longevity of electronic components.

Another advantage of the present invention is that it can be adjusted to begin the delivery of cooling air only upon an indication of undesired heat build-up, rather than continuously.

Finally, another advantage of the present invention is that it will automatically cease delivery of cooling air when indications of undesired heat build-up are no longer present.

BRIEF DESCRIPTION OF THE DRAWINGS

The advantages and features of the present invention will become better understood with reference to the following more detailed description and claims taken in conjunction with the accompanying drawings, in which like elements are identified with like symbols, and in which:

DESCRIPTION OF THE PREFERRED EMBODIMENTS

1. Detailed Description of the Figures

Figure 1:
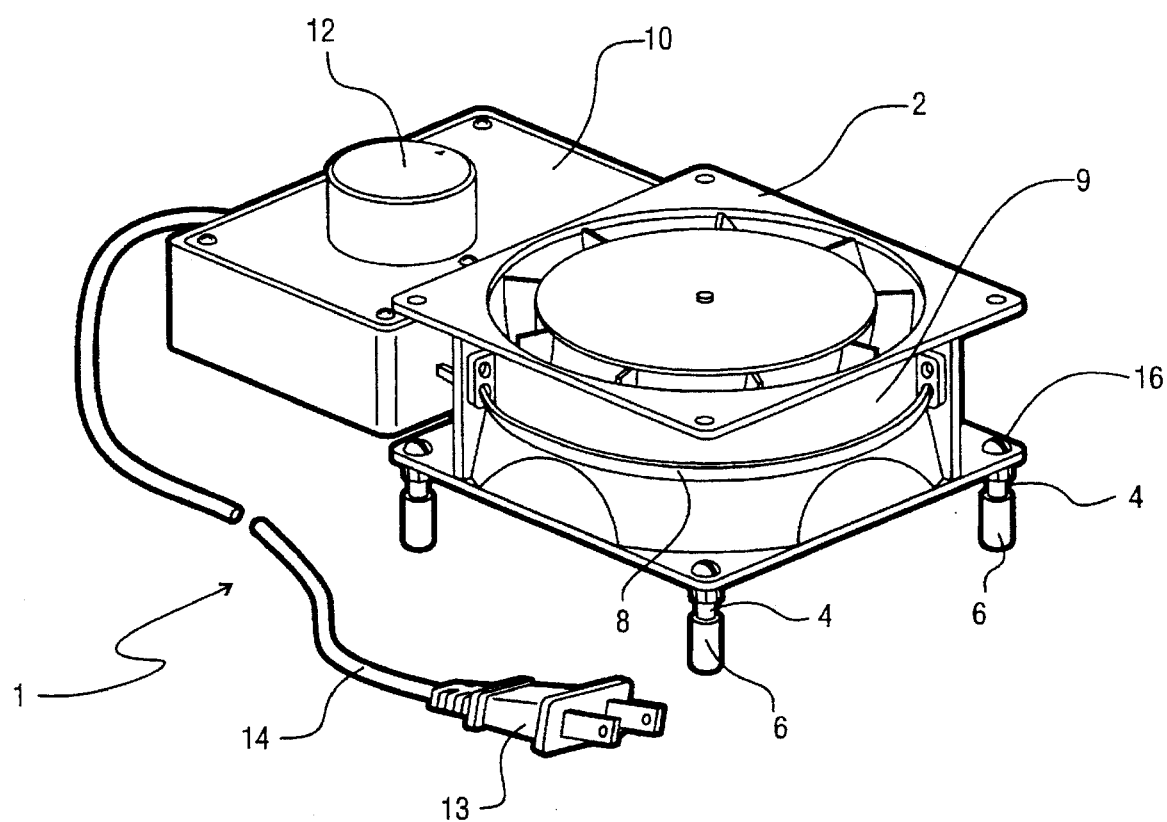
FIG. 1 is an orthographic view of a portable air cooling apparatus for electronic components according to the preferred embodiment of the present invention.

Referring now to FIG. 1, a portable air cooling apparatus 1 is shown, according to the present invention. A fan unit 2 is provided in a horizontal plane, and has a plurality of legs 4, preferably four, projecting vertically downward for support. Each leg 4 is capped with a boot 6. In its preferred embodiment it is currently envisioned that the boot 6 is composed of a rubber material such that it will provide slip-free, vibration-free support for the fan 2 when in operation. A switch attachment means 8 attaches a switching unit 10 to the fan unit 2. A standard, 110 volt plug 13 is connected to the switching unit 10 by a first power cord 14.

In that one object of the present invention is to provide a low cost, economical and efficient air cooling means that is portable, in a preferred embodiment of the present invention it is currently envisioned that the fan unit 2 would comprise a Radio Shack Model 273-242 or equivalent fan. Although many particular variations can be envisioned that would remain within the scope and intention of the present invention, such a fan unit manufactured by Radio Shack measures 3½"×3½"×1½", thereby providing a small, rugged, economical fan unit that can provide 32 cubic feet per minute (CFM) of air flow in a steady, reliable manner.

Also envisioned as a practical application of the present invention is its use with stereos or VCR's that are currently housed in confined, rack-type furniture structures. In order to provide efficient cooling in such situations it has been found effective to provide a fan unit 2 in a horizontal plane directing airflow in a downward direction, while at the same time providing a limited overall vertical height. Although many variations are envisioned that would remain consistent with the scope and disclosure of the present invention, in its preferred embodiment each leg 4 is provided as a metal tube, less than one inch long, and internally threaded and connected to the fan unit 2 via a screw fastener 16. All such described fittings are currently and economically available. Although other arrangements can be utilized effectively, it has been found that a screw+lock washer+nut combination is effective in providing sturdy, vibration free support of the fan unit 2. In such a configuration, each boot 6 is friction fitted onto the bottom of each leg 4. A control knob 12 protrudes accessibly from the switching unit 10.

Figure 2:
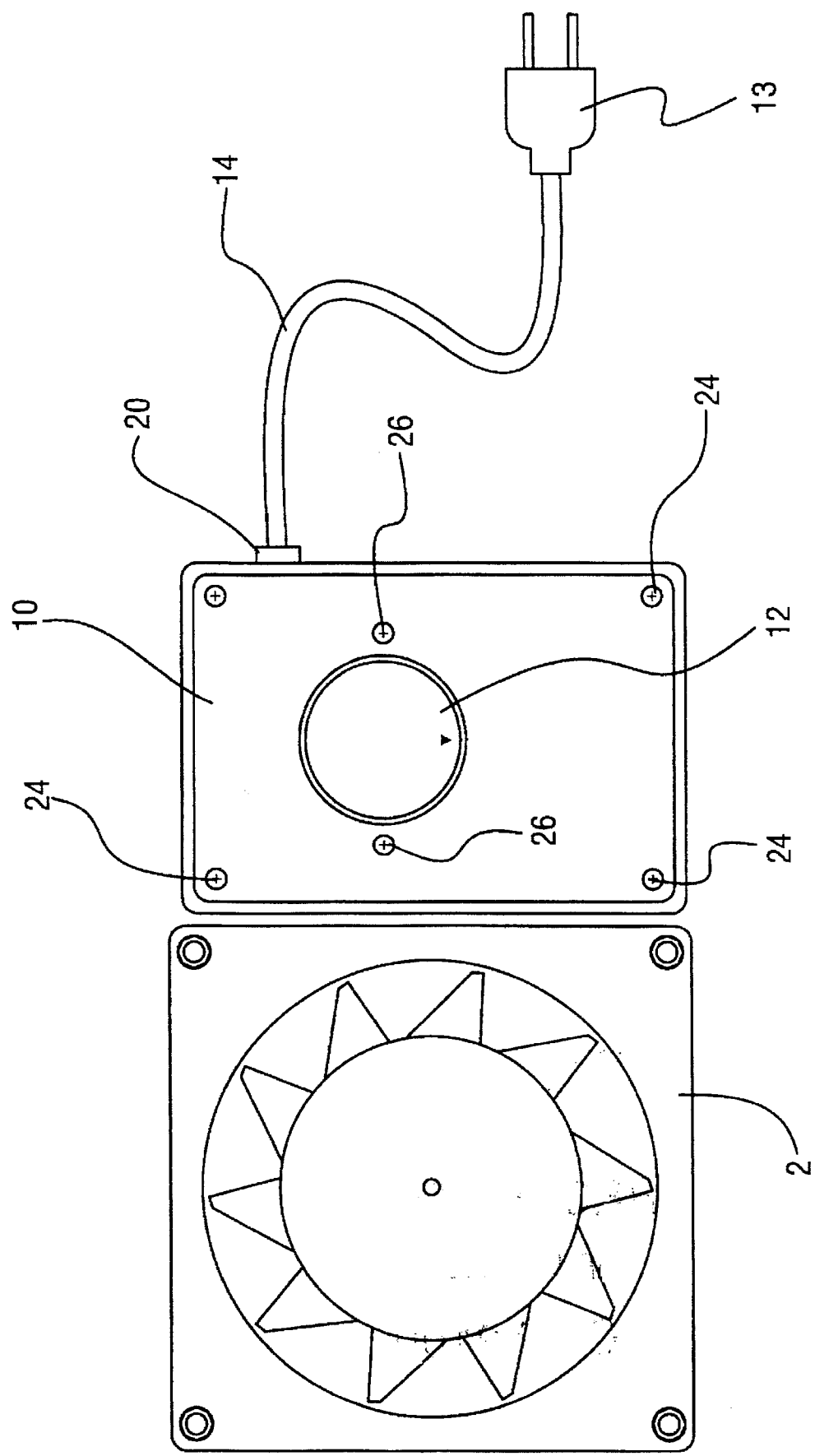
FIG. 2 is a top view of the portable air cooling apparatus depicted in FIG. 1.

Referring to FIG. 2, once again the relationship between the fan unit 2 and the switching unit 10 is shown, with the plug 13 connected to the first power cord 14. The first power cord 14 is protected from abrasive degradation at its entrance point to the switching unit 10 by a first grommet 20.

Figure 3:
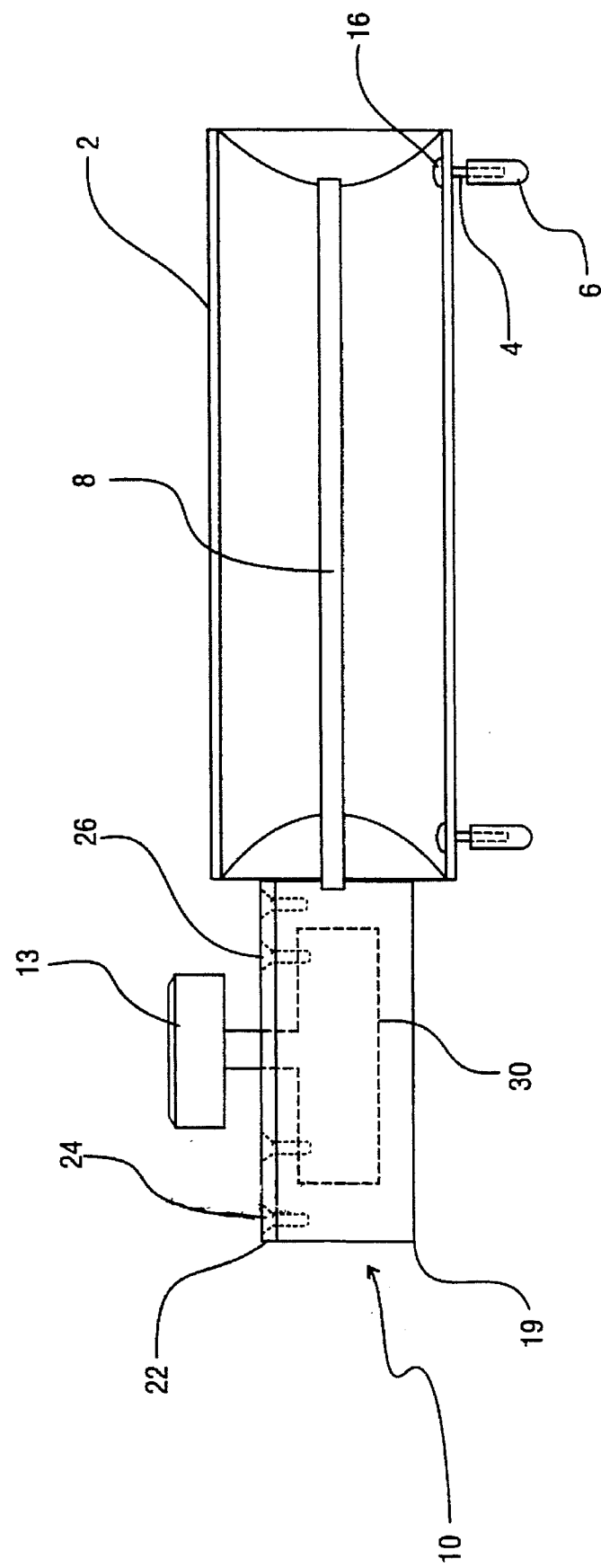
FIG. 3 is a front side view of the portable air cooling apparatus depicted in FIG. 1.

In a preferred embodiment of the present invention, it is envisioned that the switching unit 10 will have a lower plastic housing 19, shown in FIG. 3, to contain components and a stainless steel cover plate 22 attaching by cover plate screws 24 to the lower plastic housing 19 (shown in FIG. 3). Retaining screws 26 penetrate the cover plate 22 to hold and retain internal components of the switching unit 10. The control knob 12 is connected to internal components to provide the user with the ability to adjust the setpoint for the switching unit 10.

FIG. 3 shows in greater detail the attachment of the switching unit 10 to the fan unit 2 by the switch attachment means 8. The switching unit 10 is attached to the fan unit 2 by a switch attachment means 8. In its preferred embodiment, and when utilized with the components particularly described above, the switch attachment means 8 can be effectively constructed of a plastic or wire strap of the type used as a cable-tie or a wire-tie having two ends, wrapped around the fan housing 9 of the fan unit 2, and passing into and through the housing of the switching unit 10. When pulled tight and secured, such an arrangement effectively holds the switching unit 10 to the fan unit 2 by forming a loop. Also readily visible from the view depicted in FIG. 3, the legs 4 attach to the fan unit 2 by the screw fastener 16, and the legs 4 are capped with a boot 6. This provides an extremely low vertical profile which is necessary in order to provide effective cooling air flow in the variety of limited space applications that are encountered every day.

Also shown again in FIG. 3 is the lower plastic housing 19 capped by the cover plate 22 and secured by the cover plate screws 24 that comprise the switching unit 10. The control knob 12 is attached to an adjustable thermostat 30. The thermostat 30 is secured to the cover plate 22 by the retaining screws 26, and protrudes through the cover plate 22 to connect to the control knob 12.

Once again, in that one object of the present invention is to provide a low cost, economical and efficient air cooling means that is portable, in its preferred embodiment it is currently envisioned that thermostat 30 would comprise a Norstadt Model Type "A" or equivalent thermostatic switch. Although many particular variations can be envisioned that would remain within the scope and intention of the present invention, such a switch manufactured by Nortstadt provides sufficient functionality at an economical cost.

Figure 4:
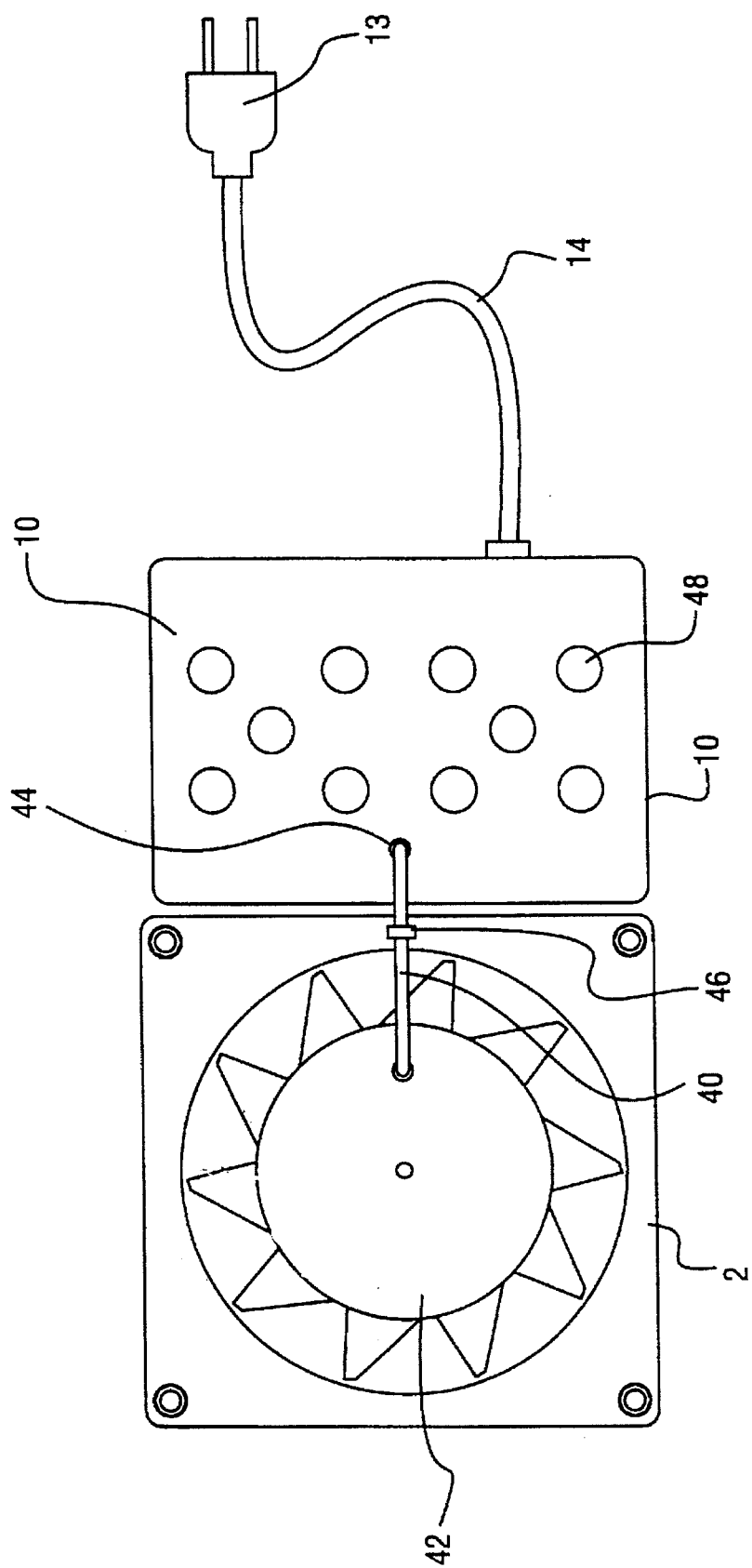
FIG. 4 is a bottom view of the portable air cooling apparatus depicted in FIG. 1.

FIG. 4 shows the bottom view of portable air cooling apparatus 1, once again showing the relationship between the fan unit 2 and the switching unit 10 is shown, with the plug 13 connected to the first power cord 14. The first power cord 14 is protected from abrasive degradation at its entrance point to the switching unit 10 by the first grommet 20. Also clearly visible in this view is a second power cord 40 providing power from the switch unit 10 to the motor 42 of the fan unit 2. A second grommet 44 is required in order to prevent abrasive damage to the second power cord 40. A retaining clip 46 keeps the second power cord 40 secured closely to the lower surface of the fan unit 2. Also shown in this view are a series of ventilation holes 48 in the bottom of the switching unit 10. These ventilation holes 48 provide a means for heat from an electrical component to rise into the switching unit 2 to activate the thermostat 30 (shown in FIG. 3).

2. Operation of the Preferred Embodiment

Figure 5:
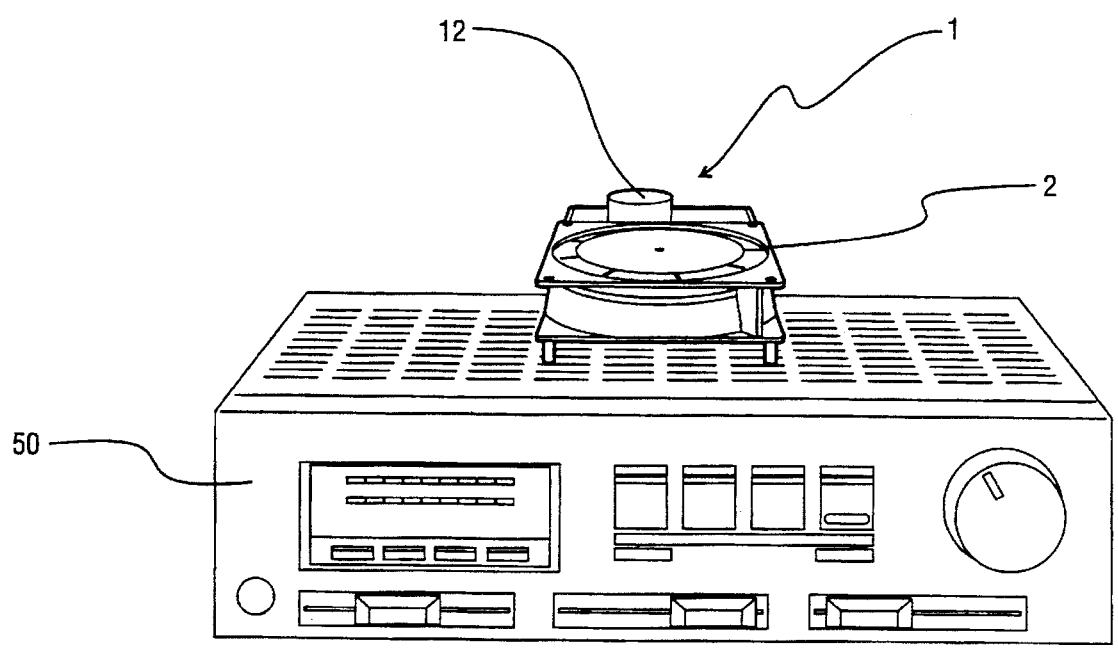
FIG. 5 is an orthographic view of the portable air cooling apparatus depicted in FIG. 1 in use with an electronic component.

To use the present invention, as shown in FIG. 5, the portable air cooling apparatus 1 is shown being used with a stereo component 50. The user simply places the portable air cooling apparatus 1 on top of the stereo component 50 and plays the stereo component 50 as usual. The portable air cooling apparatus 1 is plugged into a standard electrical outlet, and the control knob 12 is adjusted to activate the portable air cooling apparatus 1 at the desired setpoint. As the stereo component 50 generates enough heat to cause an increase in temperature greater than the desired setpoint, the portable air cooling apparatus 1 activates and energizes the fan unit 2, thereby blowing air down into the stereo component 50 and facilitating that component's cooling. When the heat generated by the stereo component 50 is dissipated enough to cause the temperature to decrease below the desired setpoint, the portable air cooling apparatus 1 deactivates and de-energizes the fan unit 2. This series continues while the stereo component 50 remains in operation.

The preferred embodiment was chosen and described in order to best explain the principles of the present invention and its practical application to those persons skilled in the art, and thereby to enable those persons skilled in the art to best utilize the present invention in various embodiments and with various modifications as are suited to the particular use contemplated. From the foregoing description, many variations will be apparent to those skilled in the art that would yet be encompassed by the spirit and scope of the invention. The scope of the invention is to be limited only by the following claims. It is intended that the scope of the present invention be broadly defined by the claims which follow.

What is claimed is:

1. A portable air cooling apparatus for electronic components, said apparatus comprising:

a horizontally mounted fan unit;

a plurality of elongated, vertically attached, legs mounted on the underside of said fan unit and wherein each said leg comprises an elongated, generally tubular rigid post having an upper end and a lower end, said upper end mounted to said fan unit;

cushioning means capping said lower end of said post;

switching means for adjustably engaging said fan unit;

switch attachment means for rigidly connecting said switching means to said fan unit;

first power means for providing power to said switching means;

second power means for providing engagement and operating power from said switching means to said fan unit; and control means for manually adjusting the operating set point of said switching means.

2. A portable air cooling apparatus for electronic components, said apparatus comprising:

a horizontally mounted fan unit;

a plurality of elongated, vertically attached, legs mounted on the underside of said fan unit;

switching means for adjustably engaging said fan unit;

switch attachment means for rigidly connecting said switching means to said fan unit, wherein said switch attachment means comprises an elongated, thin strap having two ends and wrapped securely around said fan unit and attached securely to said switching means and having both ends physically connected to form a loop around said fan unit;

first power means for providing power to said switching means;

second power means for providing engagement and operating power from said switching means to said fan unit; and control means for manually adjusting the operating set point of said switching means.

* * * * *